(12) United States Patent
Baracchi

(10) Patent No.: US 6,306,549 B1
(45) Date of Patent: Oct. 23, 2001

(54) METHOD FOR MANUFACTURING EAPSM-TYPE MASKS USED TO PRODUCE INTEGRATED CIRCUITS

(75) Inventor: Emanuele Baracchi, Caponago (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/490,193

(22) Filed: Jan. 24, 2000

(30) Foreign Application Priority Data

Feb. 3, 1999 (IT) ............................................... MI99A0204

(51) Int. Cl.$^7$ ....................................................... G03F 9/00
(52) U.S. Cl. .................................................................. 430/5
(58) Field of Search ................................. 430/5, 322, 22; 250/492.2; 356/400, 401

(56) References Cited

U.S. PATENT DOCUMENTS 6,200,708 * 3/2001 Lai ............................................ 430/5

* cited by examiner

*Primary Examiner*—S. Rosasco
(74) *Attorney, Agent, or Firm*—Lisa K. Jorgenson; Allen, Dyer, Doppelt, Milbrath & Gilchrist, P.A.

(57) ABSTRACT

A method is provided for manufacturing masks of the EAPSM type used to produce integrated circuits. The method includes forming a shifter layer on a quartz layer, forming a chromium layer on the shifter layer, and forming a resist layer on the chromium layer. The resist layer is partially removed using a first exposure to a light source. The chromium layer is etched to form a plurality of openings, and the resist layer is removed. The method further includes etching the shifter layer at the plurality of openings. An additional layer of resist is formed on portions of the chromium layer, and exposed portions of the chromium layer are removed using a second exposure to the light source with a chromium removal window having dimensions smaller than, or equal to, dimensions of a step of a stepper unit used to transfer active devices of the EAPSM mask. The additional layer of resist is then removed.

27 Claims, 2 Drawing Sheets

METHOD FOR MANUFACTURING EAPSM-TYPE MASKS USED TO PRODUCE INTEGRATED CIRCUITS

FIELD OF THE INVENTION

The present invention relates to a method for manufacturing masks of the Embedded Attenuated Phase-Shifting Mask (EAPSM) type used to produce integrated circuits.

BACKGROUND OF THE INVENTION

The production of microcircuits requires, among other steps, the repeated application of photolithographic etching The photolithographic process includes coating the surface of the semiconductor wafer with a thin and uniform film of photosensitive emulsion (photoresist). A photomask is then placed adjacent the film and the system is exposed to UV radiation. Polymerization of the photosensitive emulsion is produced through the mask at the transparent regions of the mask. After exposure, the photomask is removed and the wafer is immersed in a chemical developing bath which dissolves the non-polymerized parts of the photosensitive emulsion.

The photosensitive emulsion that has not been removed is then stabilized so that it protects the wafer when it is immersed in an acid solution which etches the $SiO_2$ layer that is not protected by the emulsion. Finally, the remaining emulsion is removed with a chemical solvent and a mechanical abrasion process. Accordingly, photomasks are important in the process for manufacturing integrated circuits.

Standard-type masks are based, as mentioned, on the passage or blocking of light, i.e., an electromagnetic field. In other words, they are totally transparent in the light regions and totally absorbent in the dark regions. However, this entails that the obtainable resolution is relatively low. It is also necessary to note that the intensity of the light that reaches the wafer through the photomask is proportional to the square of the electromagnetic field.

Masks which are improved with regards to the obtainable resolution are Phase Shift Masks (PSM) which are not based on the absorption of light, but on a 180° phase shift of the polarization of the electromagnetic field at areas that are not to be etched on the wafer. This is achieved by a "shifter" layer arranged on the mask. With these masks it is possible to achieve, as mentioned, a higher resolution with respect to standard masks and to achieve greater depth of focus on the surface of the wafer. Attenuated Phase Shift Masks (APSM) are also known which provide for partial absorption by the shifter layer.

Finally, the Embedded Attenuated Phase Shift Masks (EAPSM) are known to provide for the presence of an additional layer of surface chromium so that the shifter layer is embedded in the mask. The surface chromium layer is arranged in appropriate regions which must be protected, and must therefore be totally absorbent to prevent their double exposure to the light source from causing lithographic problems. The chromium layer blocks the light completely.

In masks of the EAPSM type, the chromium layer must therefore be present in regions where the mask provides for a double exposure due to the presence of two adjacent devices in regions where there are structures of the device that must be exposed to light radiation. The chromium layer must then be removed in accordance with process steps shown in FIG. 1, and as described in greater detail hereinafter.

The shifter layer is usually made of MoSi, MoSiON or other materials and has a transmittance of a few percent (usually 4 to 10%). FIG. 1 illustrates the standard process steps for manufacturing masks of the EAPSM type which require a double exposure. The first exposure defines the entire configuration, and the second exposure selectively removes the layer of chromium on the shifter layer, which in this case is made of MoSi.

In FIG. 1, the reference numeral 1 designates a quartz layer, the reference numeral 2 designates the shifter layer, the reference numeral 3 designates a chromium layer and the reference numeral 4 designates a photoresist layer. During step a), a first exposure/developing is performed and the layer of photoresist 4 is selectively etched.

Then, during step b), the chromium layer is etched, the photoresist layer is removed and cleaning is performed The subsequent step c) provides for etching of the shifter layer 2 at areas that are not covered by the chromium layer 3. In step d) a new photoresist layer is applied to the chromium layer 3, and a second exposure is performed to remove the chromium. Step e) provides for the etching of the chromium layer 3 and for the removal of the photoresist layer to obtain the structure shown at step e) in FIG. 1.

The method for manufacturing masks of the EAPSM type described above provides for a removal of the chromium layer according to the individual device to be drawn, i.e., a removal which is performed on a case-by-case basis and cannot be standardized.

SUMMARY OF THE INVENTION

An object of the present invention is to provide a method for manufacturing masks of the EAPSM type in which the step for removing the chromium layer can be standardized, i.e., is valid for any kind of device and for any apparatus used.

Another object of the present invention is to provide a method for manufacturing masks of the EAPSM type which can be used to produce masks which are suitable for any kind of device.

Another object of the present invention is to provide a method for manufacturing masks of the EAPSM type which allows the addition of a test structure straddling the area where the chromium layer is removed The test structure is useful to verify the resolution of the exposure apparatus and focusing Yet another object of the present invention is to provide a method for manufacturing masks of the EAPSM type which is highly reliable, relatively easy to perform and at competitive costs.

These objects and others which will become apparent hereinafter are achieved by a method for manufacturing masks of the EAPSM type used to produce integrated circuits comprising the steps of:

preparing a quartz layer on which an opaque layer of shifter is arranged, the shifter layer being in turn covered by a chromium layer on which a resist layer is applied;

partially removing the resist layer by a first exposure to a light source;

etching the chromium layer to form therein a plurality of openings at active devices formed in the quartz layer, and removing the resist layer;

etching the opaque shifter layer at the openings; and applying an additional layer of resist, removing the layer of chromium by a second exposure to a light source, and removing the additional layer of resist. The step of removing the chromium layer by a second exposure to a light source is performed using a chromium removal window whose dimensions are smaller than, or equal to, the dimensions of the step of a stepper unit used to transfer the active devices of the EAPSM mask onto a wafer.

BRIEF DESCRIPTION OF THE DRAWINGS

Further characteristics and advantages of the method according to the invention will become apparent from the following detailed description of preferred, but not exclusive embodiments, of the method according to the present invention, illustrated only by way of non-limiting examples in the accompanying drawings, wherein.

DETAILED DESCRIPTION OF THE PREFERRED EMBODIMENTS

Figure 1:
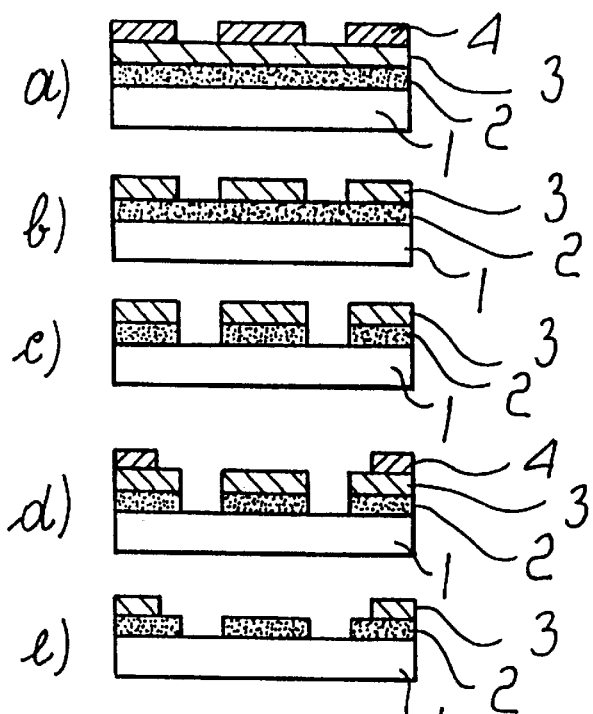
FIG. 1 illustrates a sequence of process steps for manufacturing masks of the EAPSM type according to the prior art.

With reference to the above figures, in which identical reference numerals designate identical elements, and with particular reference to FIGS. 2 to 4 since FIG. 1 has already been described, the method according to the present invention is as follows.

The chromium layer 3 is removed by using a chromium removal window at step d) as shown in FIG. 1. The dimensions of the chromium layer removal window, designated by the reference numeral 15 in FIGS. 2 and 3, must be smaller than, or at the most equal to, the step of the stepper unit.

The dimensions of the chromium removal window 15 must match the dimensions of the regions where the mask compensates for a double exposure, i.e., exposures due to two adjacent devices. In detail, the chromium removal window 15, as shown in FIGS. 2 and 3, has a corner which coincides with a corner of the area that contains the devices 10. The opposite corner of the window 15 coincides with the corner of the device 10 that lies opposite the preceding corner. In this manner, the area of the shifter layer 2 never overlaps the area of a shifter layer 2 of the frame that contains adjacent devices.

Figure 2:
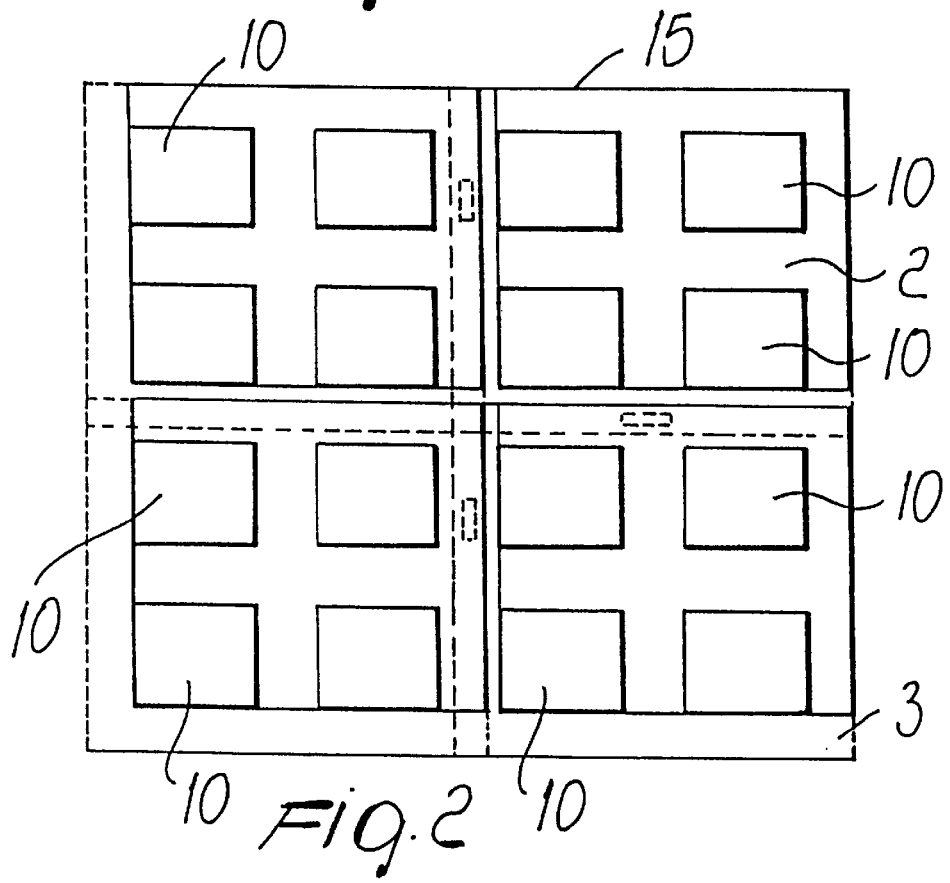
FIG. 2 is a schematic plan view of windows for removing the chromium layer formed with the method according to the present invention.
Figure 3:
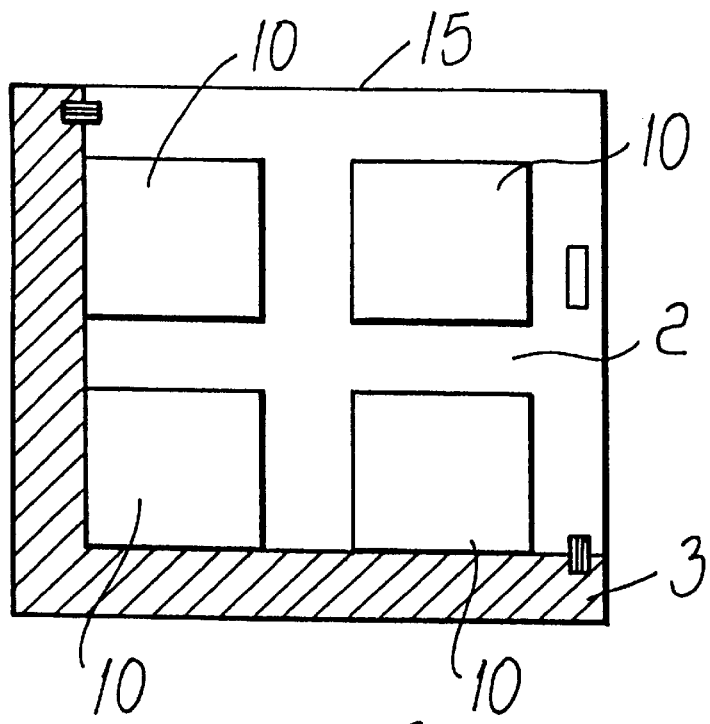
FIG. 3 is a schematic plan view showing in detail a single process step according to the present invention.

The dashed lines of FIG. 2 indicate the step of the stepper unit, and it is clear that the chromium removal window 15 has a corner which coincides with a corner of the area formed by a single step of the stepper unit. It is also clear that the opposite corner of the window coincides with a corner of one of the active devices of the EAPSM mask.

The active device 10 whose corner coincides with the corner of the chromium removal window 15 is an active device whose distance from an active device 10 located outside the chromium removal window 15 is equal to the distance from an active device 10 which is aligned therewith and is arranged within the chromium removal window 15.

Figure 4:
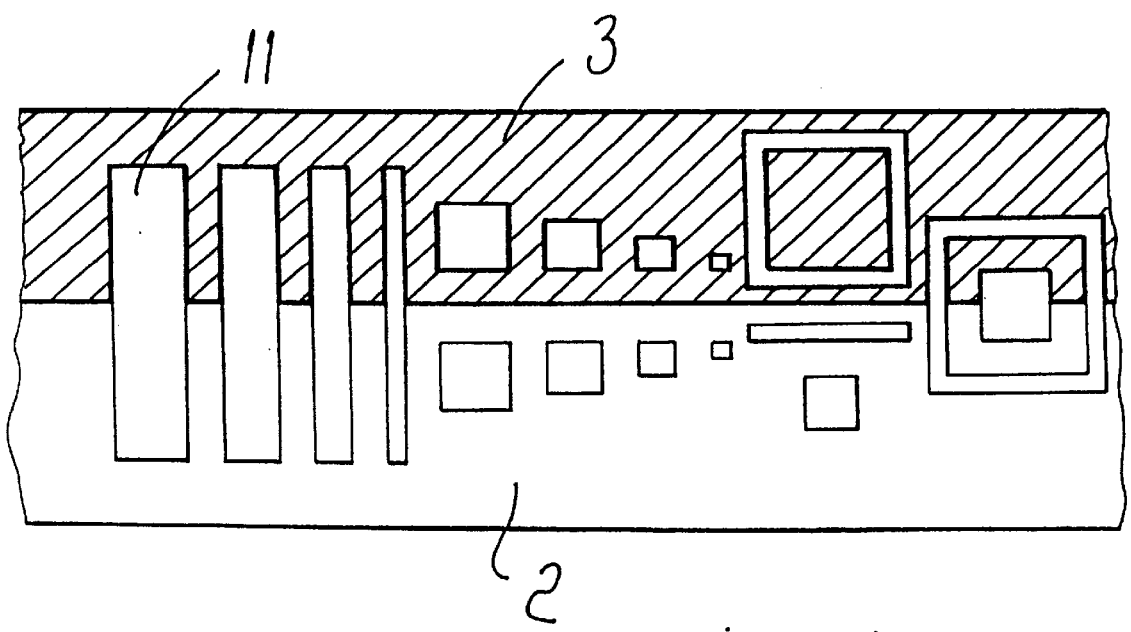
FIG. 4 is a partial schematic plan view of test structures inserted to straddle the chromium layer removal area in the method according to the present invention.

As shown in FIG. 4, it is also possible to provide test structures 11 arranged so as to straddle the transition area between the chromium 3 and the shifter layer 2. The method according to the invention is particularly adapted for masks of the EAPSM type which are advantageously used for processes on the order of 0.25 and 0.18 micrometers, which require a higher resolution than obtainable with conventional masks.

In practice it has been observed that the method according to the invention fully achieves the intended aim and objects, since it provides removal of the chromium layer which is independent of the configuration of the devices and is independent of any kind of unit that can be used to manufacture masks of the EAPSM type.

The method thus conceived is susceptible of numerous modifications and variations, all of which are within the scope of the present invention. All the details may also be replaced with other technically equivalent elements The disclosures in Italian Patent Application No. MI99A000204 from which this application claims priority are incorporated herein by reference.

That which is claimed is:

1. A method for manufacturing masks of the Embedded Attenuated Phase-Shifting (EAPSM) type used to produce integrated circuits, the method comprising the steps of:

forming a shifter layer on a quartz layer, forming a chromium layer on the shifter layer, and forming a resist layer on the chromium layer;

partially removing the resist layer using a first exposure to a light source;

etching the chromium layer to form a plurality of openings, and removing the resist layer;

etching the shifter layer at the plurality of openings; and forming an additional layer of resist on portions of the chromium layer, removing exposed portions of the chromium layer using a second exposure to the light source with a chromium removal window having dimensions smaller than, or equal to, dimensions of a step of a stepper unit used to transfer active devices of the EAPSM mask, and removing the additional layer of resist.

2. A method according to claim 1, wherein the chromium removal window has a corner which coincides with a corner of an area defined by a single step of the stepper unit, and an opposite corner of the chromium removal window coincides with a corner of one of the active devices of the EAPSM mask.

3. A method according to claim 2, wherein the active device whose corner coincides with the corner of the chromium removal window is an active device whose distance from an active device located outside the chromium removal window is equal to a distance from an active device aligned therewith and arranged within the chromium removal window.

4. A method according to claim 3, wherein the chromium removal window is independent of a structure of the active devices.

5. A method according to claim 1, wherein the chromium removal window exposes the shifter layer.

6. A method according to claim 1, wherein test structures are provided which straddle the chromium removal window.

7. A method according to claim 6, wherein the test structures are arranged at a transition area between the chromium and shifter layers.

8. A method for manufacturing masks of the Embedded Attenuated Phase-Shifting (EAPSM) type used to produce integrated circuits, the method comprising the steps of:

forming a shifter layer on a quartz layer, and forming a light blocking layer on the shifter layer;

etching the light blocking layer and the shifter layer to form a plurality of openings; and forming a layer of resist on portions of the light blocking layer, removing exposed portions of the light blocking layer using an exposure to a light source with a removal window having dimensions smaller than, or equal to, dimensions of a step of a stepper unit used to transfer active devices of the EAPSM mask, and removing the layer of resist.

9. A method according to claim 8, wherein the light blocking layer comprises chromium.

10. A method according to claim 8, wherein before the step of etching to form the plurality of openings the method comprises:

forming an initial resist layer on the light blocking layer; and partially removing the initial resist layer using an exposure to the light source to expose the light blocking layer corresponding to the plurality of openings.

11. A method according to claim 10, further comprising the step of removing the initial resist layer after forming the plurality of openings.

12. A method according to claim 8, wherein the removal window has a corner which coincides with a corner of an area defined by a single step of the stepper unit, and an opposite corner of the removal window coincides with a corner of one of the active devices of the EAPSM mask.

13. A method according to claim 12, wherein the active device whose corner coincides with the corner of the removal window is an active device whose distance from an active device located outside the removal window is equal to a distance from an active device aligned therewith and arranged within the removal window.

14. A method according to claim 13, wherein the removal window is independent of a structure of the active devices.

15. A method according to claim 8, wherein the removal window exposes the shifter layer.

16. A method according to claim 8, wherein test structures are provided which straddle the removal window.

17. A method according to claim 16, wherein the test structures are arranged at a transition area between the light blocking and shifter layers.

18. A method for manufacturing masks of the Embedded Attenuated Phase-Shifting (EAPSM) type used to produce integrated circuits, the method comprising the steps of:

forming a shifter layer on a quartz layer, and forming a light blocking layer on the shifter layer;

etching the light blocking layer and the shifter layer to form a plurality of openings; and forming a layer of resist on portions of the light blocking layer, removing exposed portions of the light blocking layer using an exposure to a light source with a removal window having dimensions smaller than, or equal to, dimensions of a step of a stepper unit used to transfer active devices of the EAPSM mask;

the removal window has a corner which coincides with a corner of an area defined by a single step of the stepper unit, and an opposite corner of the removal window coincides with a corner of one of the active devices of the EAPSM mask.

19. A method according to claim 18, further comprising the step of removing the layer of resist.

20. A method according to claim 18, wherein the light blocking layer comprises chromium.

21. A method according to claim 18, wherein before the step of etching to form the plurality of openings the method comprises:

forming an initial resist layer on the light blocking layer; and partially removing the initial resist layer using an exposure to the light source to expose the light blocking layer corresponding to the plurality of openings.

22. A method according to claim 21, further comprising the step of removing the initial resist layer after forming the plurality of openings.

23. A method according to claim 18, wherein the active device whose corner coincides with the corner of the removal window is an active device whose distance from an active device located outside the removal window is equal to a distance from an active device aligned therewith and arranged within the removal window.

24. A method according to claim 23, wherein the removal window is independent of a structure of the active devices.

25. A method according to claim 18, wherein the removal window exposes the shifter layer.

26. A method according to claim 18, wherein test structures are provided which straddle the removal window.

27. A method according to claim 26, wherein the test structures are arranged at a transition area between the light blocking and shifter layers.

* * * * *